United States Patent [19]
Beffa

[11] Patent Number: 6,100,486
[45] Date of Patent: Aug. 8, 2000

[54] METHOD FOR SORTING INTEGRATED CIRCUIT DEVICES

[75] Inventor: Raymond J. Beffa, Boise, Id.

[73] Assignee: Micron Technology, Inc., Boise, Id.

[21] Appl. No.: 09/133,338

[22] Filed: Aug. 13, 1998

[51] Int. Cl.[7] ........................... B07C 5/344; G01R 31/02
[52] U.S. Cl. ......................... 209/573; 209/571; 324/704
[58] Field of Search ................................... 209/571, 572, 209/573; 324/764, 765, 759

[56] References Cited

U.S. PATENT DOCUMENTS

| | | | |
|---|---|---|---|
| 4,510,673 | 4/1985 | Shils et al. | 438/15 |
| 4,667,403 | 5/1987 | Edinger et al. | 29/840 |
| 4,871,963 | 10/1989 | Cozzi | 209/573 |
| 4,954,453 | 9/1990 | Venutolo | 29/592 |
| 4,958,373 | 9/1990 | Usami et al. | 382/149 |
| 4,967,381 | 10/1990 | Lane et al. | 702/81 |
| 5,003,251 | 3/1991 | Fuoco | 324/158 |
| 5,103,166 | 4/1992 | Jeon et al. | 324/764 |
| 5,105,362 | 4/1992 | Kotani | 700/108 |
| 5,217,834 | 6/1993 | Higaki | 430/30 |
| 5,219,765 | 6/1993 | Yoshida et al. | 324/500 |
| 5,226,118 | 7/1993 | Baker et al. | 345/357 |
| 5,271,796 | 12/1993 | Miyashita et al. | 438/16 |
| 5,289,113 | 2/1994 | Meaney et al. | 324/73.1 |
| 5,294,812 | 3/1994 | Hashimoto et al. | 257/65 |
| 5,301,143 | 4/1994 | Ohri et al. | 365/96 |
| 5,420,796 | 5/1995 | Weling et al. | 438/5 |
| 5,440,493 | 8/1995 | Doida | 438/18 |
| 5,442,561 | 8/1995 | Yoshizawa et al. | 700/121 |
| 5,450,326 | 9/1995 | Black | 700/100 |
| 5,467,304 | 11/1995 | Uchida et al. | 365/174 |
| 5,483,175 | 1/1996 | Ahmad et al. | 700/99 |
| 5,495,417 | 2/1996 | Fuduka et al. | 438/10 |
| 5,511,005 | 4/1996 | Abbe et al. | 702/84 |
| 5,516,028 | 5/1996 | Rasp et al. | 228/104 |
| 5,538,141 | 7/1996 | Gross, Jr. et al. | 209/571 |
| 5,568,408 | 10/1996 | Maeda | 702/117 |
| 5,581,510 | 12/1996 | Furusho et al. | 365/201 |
| 5,603,412 | 2/1997 | Gross, Jr. et al. | 209/571 |
| 5,642,307 | 6/1997 | Jernigan | 365/103 |
| 5,844,803 | 12/1998 | Beffa | 364/468.28 |
| 5,865,319 | 2/1999 | Okuda et al. | 209/574 |
| 5,915,231 | 6/1999 | Beffa | 702/118 |

FOREIGN PATENT DOCUMENTS

| | | |
|---|---|---|
| 58-50728 | 3/1983 | Japan . |
| 58-60529 | 4/1983 | Japan . |
| 361120433 | 6/1986 | Japan . |
| 405013529 | 1/1993 | Japan . |
| 5-74909 | 3/1993 | Japan . |
| 1151-333 | 4/1985 | U.S.S.R. . |

*Primary Examiner*—Donald P. Walsh
*Assistant Examiner*—Daniel K. Schlak
*Attorney, Agent, or Firm*—Trask, Britt & Rossa

[57] ABSTRACT

An inventive method for sorting integrated circuit (IC) devices of the type having a substantially unique identification (ID) code, such as a fuse ID, includes automatically reading the ID code of each of the IC devices, and sorting the IC devices in accordance with their automatically read ID codes. The inventive method can be used in conjunction with an IC manufacturing process that includes providing semiconductor wafers, fabricating the IC's on each of the wafers, causing each of the IC's to store its ID code, separating each of the IC's from its wafer to form IC dice, assembling the IC dice into IC devices, and testing the IC devices. The inventive method is useful for, among other things, culling IC reject bins for shippable IC's, sorting IC's from a wafer lot into those that require enhanced reliability testing and those that do riot, and allowing IC's fabricated using both a control fabrication process recipe and a new fabrication process recipe under test to be assembled and tested using the same equipment to reduce unintended test variables introduced when the IC's are assembled and tested separately.

3 Claims, 8 Drawing Sheets

METHOD FOR SORTING INTEGRATED CIRCUIT DEVICES

CROSS-REFERENCE TO RELATED APPLICATIONS

The present application is related to: a co-pending application having Ser. No. 08/785,353 entitled "METHOD FOR SORTING INTEGRATED CIRCUIT DEVICES," and filed Jan. 17, 1997; a co-pending application having Ser. No. 08/591,238, entitled "METHOD AND APARATUS [sic] FOR STORAGE OF TEST RESULTS WITHIN AN INTEGRATED CIRCUIT," and filed Jan. 17, 1996; a copending application having Ser. No. 08/664,109, entitled "A STRUCTURE AND A METHOD FOR STORING INFORMATION IN A SEMICONDUCTOR DEVICE," and filed Jun. 13, 1996; a divisional application having Ser. No. 09/133,336, entitled "METHOD FOR SORTING INTEGRATED CIRCUIT DEVICES" and filed concurrently herewith, a co-pending application having Ser. No. 08/822,731, entitled "METHOD FOR CONTINUOUS, NON LOT-BASED INTEGRATED CIRCUIT MANUFACTURING," and filed Mar. 24, 1997; a co-pending application having Ser. No. 08/806,442, entitled "METHOD IN AN INTEGRATED CIRCUIT (IC) MANUFACTURING PROCESS FOR IDENTIFYING AND RE-DIRECTING IC'S MIS-PROCESSED DURING THEIR MANUFACTURE," and filed Feb. 26, 1997; a co-pending application having Ser. No. 08/871,015, entitled "METHOD FOR USING DATA REGARDING MANUFACTURING PROCEDURES INTEGRATED CIRCUITS (IC'S) HAVE UNDERGONE, SUCH AS REPAIRS, TO SELECT PROCEDURES THE IC'S WILL UNDERGO, SUCH AS ADDITIONAL REPAIRS," and filed Jun. 6, 1997; and a co-pending application having Ser. No. 08/801,565 entitled "METHOD OF SORTING A GROUP OF INTEGRATED CIRCUIT DEVICES FOR THOSE DEVICES REQUIRING SPECIAL TESTING," and filed Feb. 17, 1997.

BACKGROUND

1. Field of the Invention

The present invention relates in general to integrated circuit (IC) manufacturing and, more specifically, to methods in IC manufacturing processes for sorting IC devices using identification (ID) codes, such as fuse ID's, in the devices.

2. State of the Art

Integrated circuits (IC's) are small electronic circuits formed on the surface of a wafer of semiconductor material, such as silicon, in an IC manufacturing process referred to as "fabrication." Once fabricated, IC's are electronically probed to evaluate a variety of their electronic characteristics, cut from the wafer on which they were formed into discrete IC dice or "chips," and then assembled for customer use using various well-known IC packaging techniques, including lead Frame packaging, Chip-On-Board (COB) packaging, and flip-chip packaging.

Before being shipped to customers, packaged IC's are generally tested to ensure they will function properly once shipped. Testing typically involves a variety of known test steps, such as pre-grade, burn-in, and final, which test IC's for defects and functionality and grade IC's for speed. As shown in FIG. 1, IC's that pass the described testing are generally shipped to customers, while IC's that fail the testing are typically rejected.

The testing standards for a particular IC product are sometimes relaxed as the product "matures" such that IC's previously rejected under strict testing standards may pass the relaxed testing standards. Consequently, reject bins containing previously rejected IC's are sometimes "culled" for IC's that are shippable under relaxed testing standards by testing the rejected IC's again using the relaxed testing standards. Unfortunately, while this "culling" process does retrieve shippable IC's from reject bins, it makes inefficient use of expensive and often limited testing resources by diverting those resources away from testing untested IC's in order to retest previously rejected IC's. Therefore, there is a need in the art for an improved method of "culling" or sorting such reject bins for shippable IC's.

Similarly, as shown in FIG. 2, all the IC's from the wafers in a wafer lot typically undergo enhanced reliability testing that is more extensive and strict than normal testing when any of the wafers in the lot are deemed to be unreliable because of fabrication or other process errors. Since a wafer lot typically consists of fifty or more wafers, many of the IC's that undergo the enhanced reliability testing do not require it because they come from wafers that are not deemed unreliable. Performing enhanced reliability testing on IC's that do not need it is inefficient because such testing is typically more time-consuming and uses more resources than normal testing. Therefore, there is a need in the art for a method of sorting IC's from a wafer lot into those IC's that require enhanced reliability testing and those that do not.

Likewise, as shown in FIG. 3, a new or special "recipe" for fabricating IC's on wafers is sometimes tested by fabricating some wafers from a wafer lot using the special recipe and other wafers from the wafer lot using a control recipe. IC's from the wafers then typically undergo separate assembly and test procedures so that the test results of IC's fabricated using the special recipe are not mixed with the test results of IC's fabricated using the control recipe, and vice versa. Test reports from the separate test procedures are then used to evaluate the special recipe and to determine whether the IC's are to be shipped to customers, reworked, repaired, retested, or rejected. Unfortunately, because the IC's undergo separate test and assembly procedures, undesirable variables, such as differences in assembly and test equipment, are introduced into the testing of the special recipe. It would be desirable, instead, to be able to assemble and test the IC's using the same assembly and test procedures, and to then sort the IC's and their test results into those IC's fabricated using the special recipe and those IC's fabricated using the control recipe. Therefore, there is a need in the art for a method of identifying individual IC's fabricated using a special or control recipe and sorting the IC's based on their fabrication recipe.

As described above, IC's are typically tested for various characteristics before being shipped to customers. For example, as shown in FIG. 4, IC's may be graded in test for speed and placed in various bins (e.g., 5 nanoseconds (ns), 6 ns, and 7 ns bins) according to their grading. If a customer subsequently requests a more stringent speed grade (e.g., 4 ns), IC's in one of the bins (e.g., a 5 ns bin) are re-tested and thereby sorted into IC's that meet the more stringent speed grade (e.g., 4 ns bin) and those that do not (e.g., 5 ns bin). While this conventional process sorts the IC's into separate speed grades, it makes inefficient use of expensive and often limited testing resources by diverting those resources away from testing untested IC's in order to retest previously tested IC's. Therefore, there is a need in the art for an improved method of "culling" or sorting bins for IC's that meet more stringent standards, such as a higher speed grading.

As described in U.S. Pat. Nos. 5,301,143, 5,294,812, and 5,103,166, some methods have been devised to electronically identify individual IC's. Such methods take place "off" the manufacturing line, and involve the use of electrically retrievable ID codes, such as so-called "fuse ID's," programmed into individual IC's to identify the IC's. The programming of a fuse ID typically involves selectively blowing an arrangement of fuses and anti-fuses in an IC so that when the fuses or anti-fuses are accessed, they output a selected ID code. Unfortunately, none of these methods addresses the problem of identifying and sorting IC's "on" a manufacturing line.

SUMMARY OF THE INVENTION

An incentive method for sorting integrated circuit (IC) devices of the type to have a substantially unique identification (ID) code, such as a fuse ID, includes automatically reading the ID code of each of the IC devices and sorting the IC devices according to their automatically read ID codes. The inventive method can be used in conjunction with an IC manufacturing process that includes providing semiconductor wafers, fabricating the IC's on each of the wafers, causing each of the IC's to store its ID code, separating each of the IC's from its wafer to form an IC die, assembling the IC dice into IC devices, and testing the IC devices. The method can also be used in conjunction with Single In-line Memory Module (SIMM), Dual In-line Memory Module (DIMM), and other multi-chip module (MCM) manufacturing processes.

In another embodiment, an inventive method for recovering IC devices from a group of IC devices that have previously been rejected in accordance with a test standard that has since been relaxed includes: storing test results that caused each of the IC devices in the group to be rejected in connection with an ID code, such as a fuse ID, associated with each device; automatically reading the ID code from each of the IC devices; accessing the test results stored in connection with each of the automatically read ID codes; comparing the accessed test results for each of the IC devices with the relaxed test standard; and sorting the IC devices according to whether their accessed test results pass the relaxed test standard in order to recover any of the IC devices having test results that pass the relaxed test standard.

By sorting the IC devices in accordance with their previously stored test results and their ID codes, the above-described inventive method eliminates the need to retest the IC devices after the test standard is relaxed in order to cull shippable IC devices from the rejected devices.

In still another embodiment, a method for sorting a group of IC devices in accordance with a first IC standard, such as a speed standard, that have previously been sorted in accordance with a second IC standard, such as a speed standard that is less stringent than the first, includes storing test results that caused each of the IC devices in the group to be sorted into the group in connection with ID codes, such as fuse ID's, of the devices, automatically reading the ID code from each of the IC devices, accessing the test results stored in connection with each of the automatically read ID codes, comparing the accessed test results for each of the IC devices with the first IC standard, and sorting the IC devices according to whether their test results pass the first IC standard.

In a further embodiment, an inventive back-end test method for separating IC devices in need of enhanced reliability testing from a group of IC devices undergoing back-end test procedures includes: storing a flag in connection with an ID code, such as a fuse ID, associated with each of the IC devices in the group indicating whether each IC device is in need of enhanced reliability testing; automatically reading the ID code of each of the IC devices in the group; accessing the enhanced reliability testing flag stored in connection with each of the automatically read ID codes; and sorting the IC devices in accordance with whether their enhanced reliability testing flag indicates they are in need of enhanced reliability testing.

Thus, the inventive method described above provides an advantageous method for sorting IC's from the same wafer lot into those IC's that require enhanced reliability testing and those that do not.

In a still further embodiment, an inventive method in an IC manufacturing process for testing different fabrication process recipes includes the following: providing first and second pluralities of semiconductor wafers; fabricating a first plurality of IC's on each of the first plurality of wafers in accordance with a control recipe; fabricating a second plurality of IC's on each of the second plurality of wafers in accordance with a test recipe; causing each of the IC's on each of the wafers to permanently store a substantially unique ID code, such as a fuse ID; separating each of the IC's on each of the wafers from its wafer to form one of a plurality of IC dice; assembling each of the IC dice into an IC device; automatically reading the ID code from the IC in each of the IC devices; testing each of the IC devices; and sorting each of the IC devices in accordance with the automatically read ID code from the IC in each of the IC devices indicating the IC is from one of the first and second pluralities of IC's.

DETAILED DESCRIPTION OF THE PREFERRED EMBODIMENTS

Figure 1:
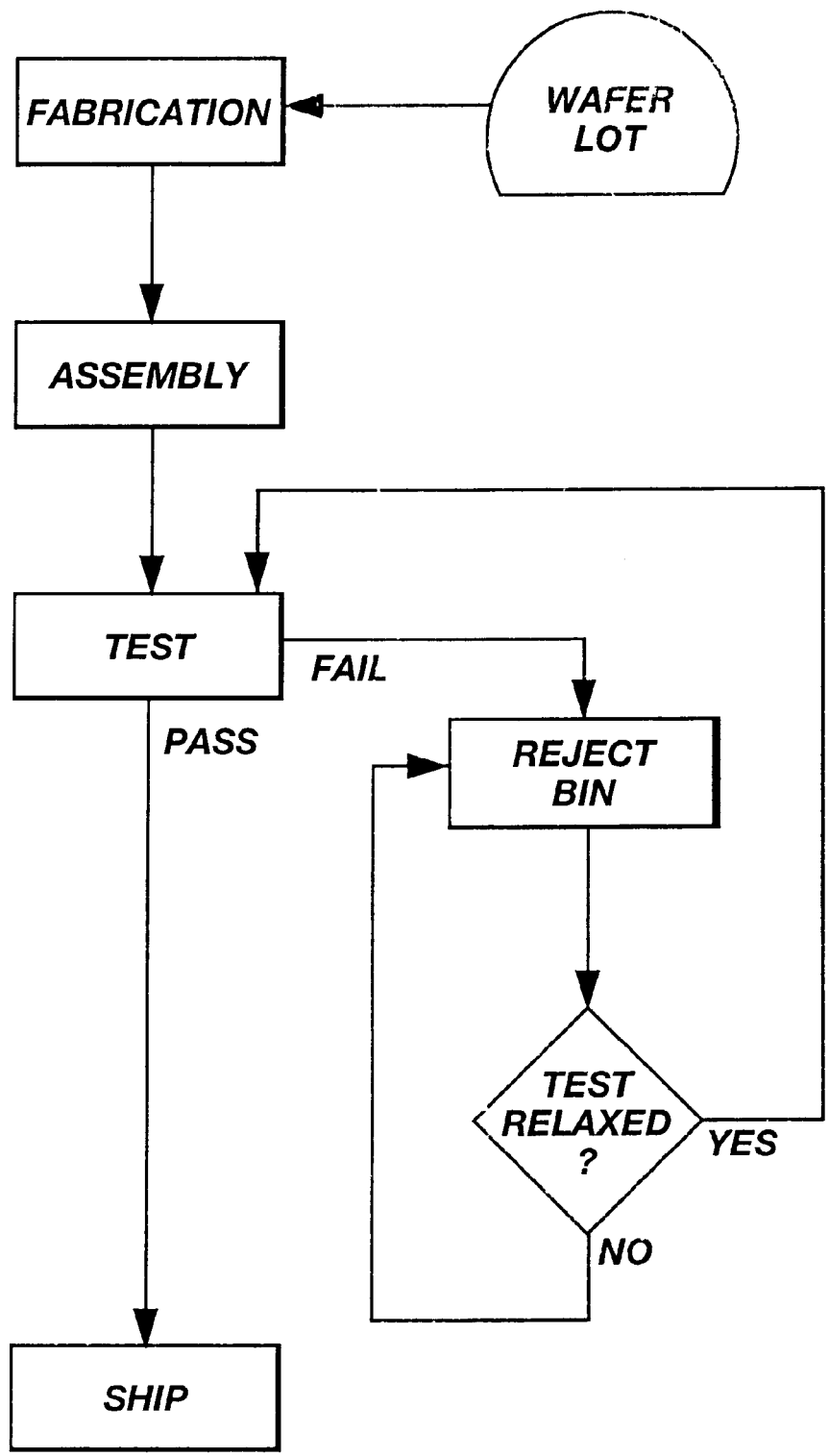
FIG. 1 is a flow diagram illustrating a conventional procedure in an integrated circuit (IC) manufacturing process for culling shippable IC's from a reject bin.
Figure 2:
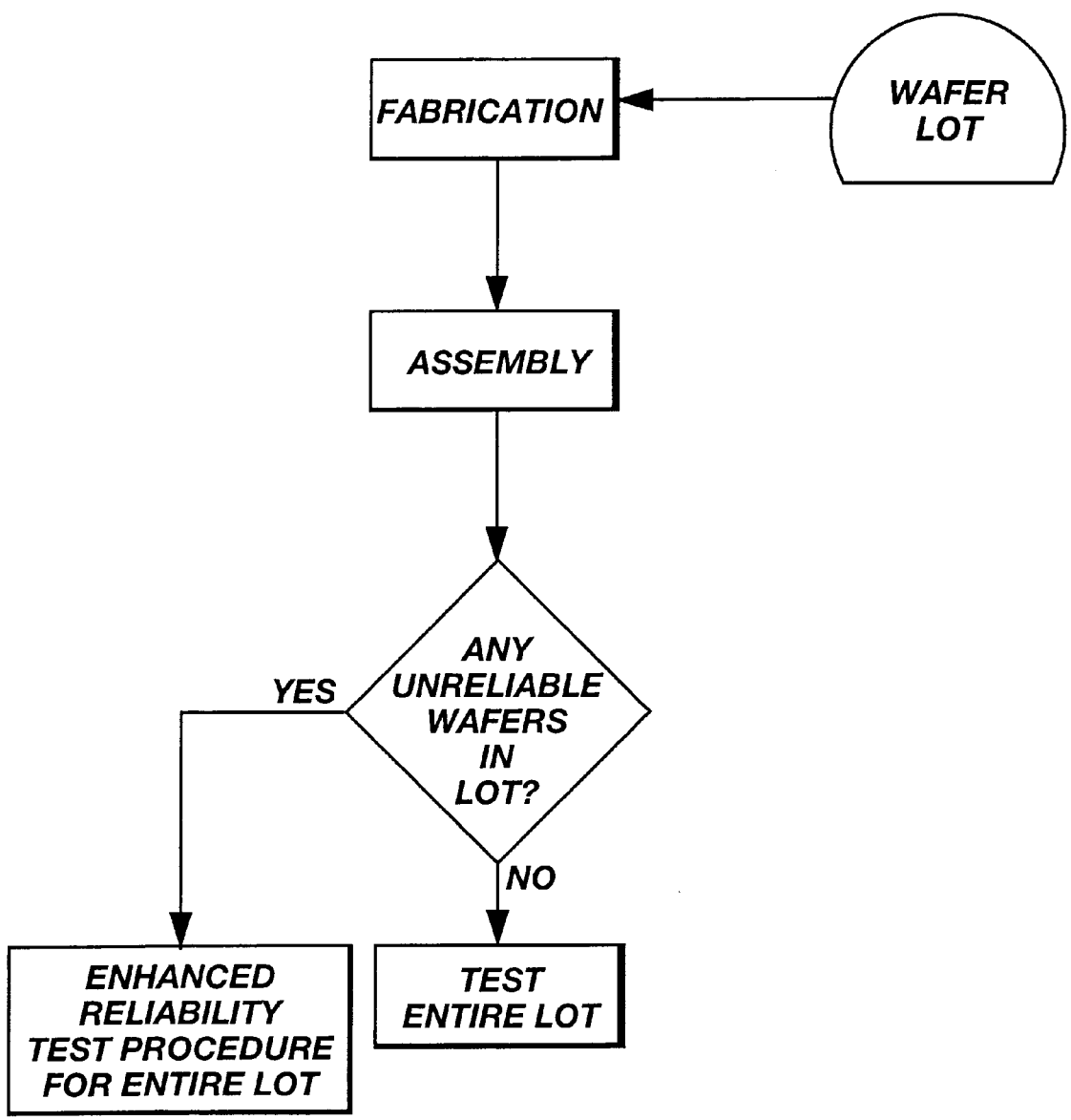
FIG. 2 is a flow diagram illustrating a conventional procedure in an IC manufacturing process for directing IC's to enhanced reliability testing.
Figure 3:
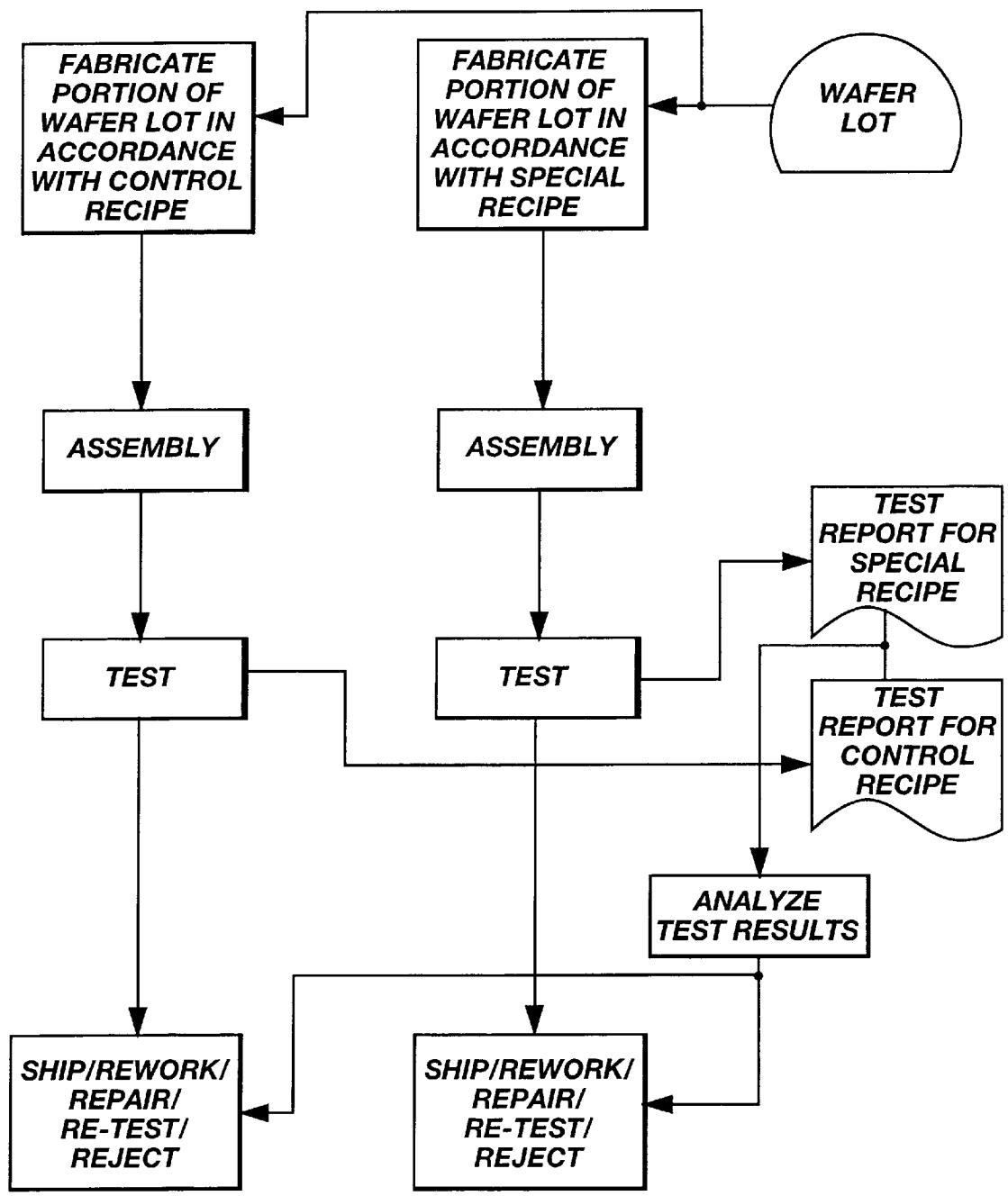
FIG. 3 is a flow diagram illustrating a conventional procedure in an IC manufacturing process for testing a new or special fabrication process recipe.
Figure 4:
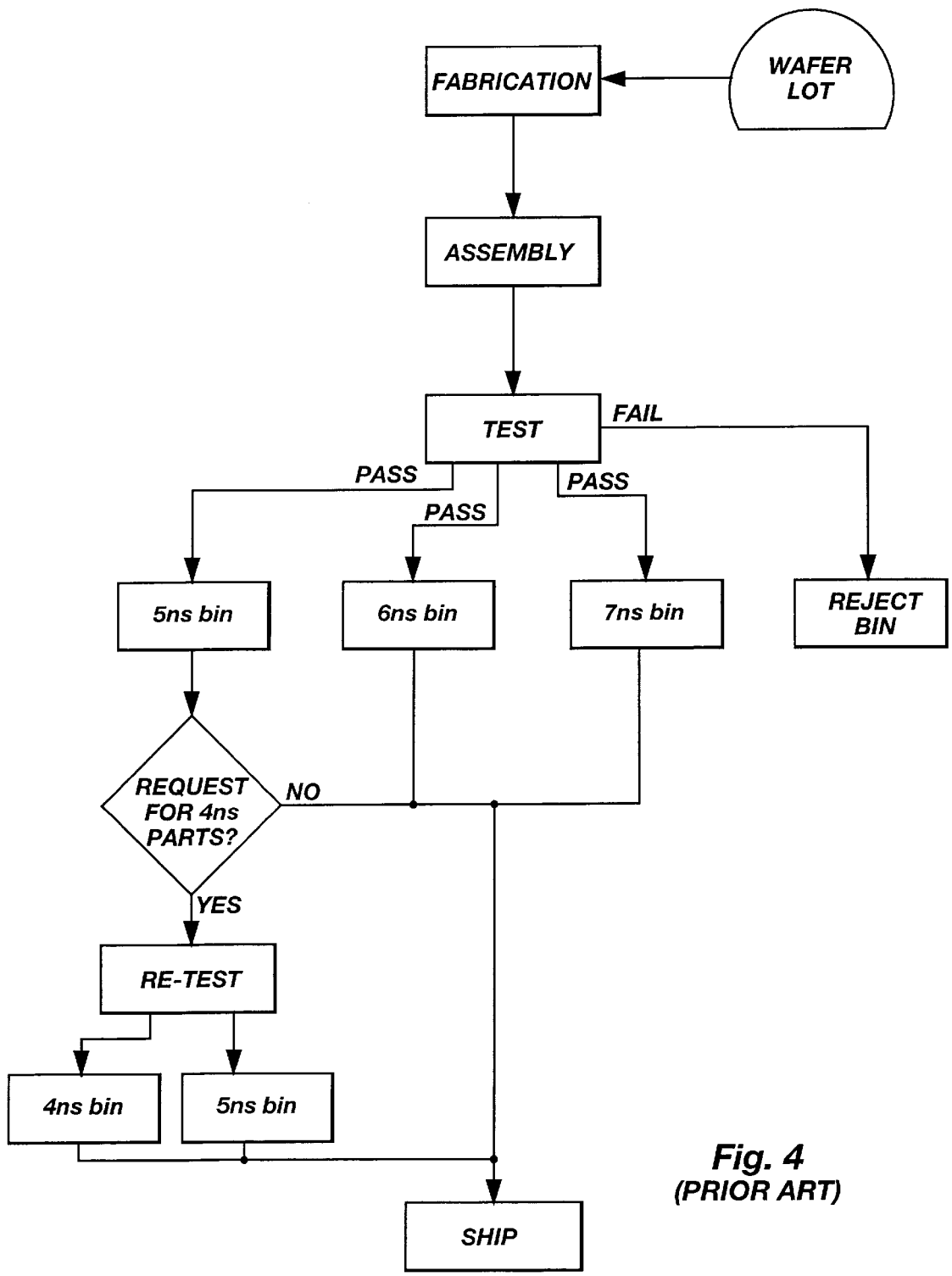
FIG. 4 is a flow diagram illustrating a conventional procedure in an IC manufacturing process for speed-sorting IC's.
Figure 5:
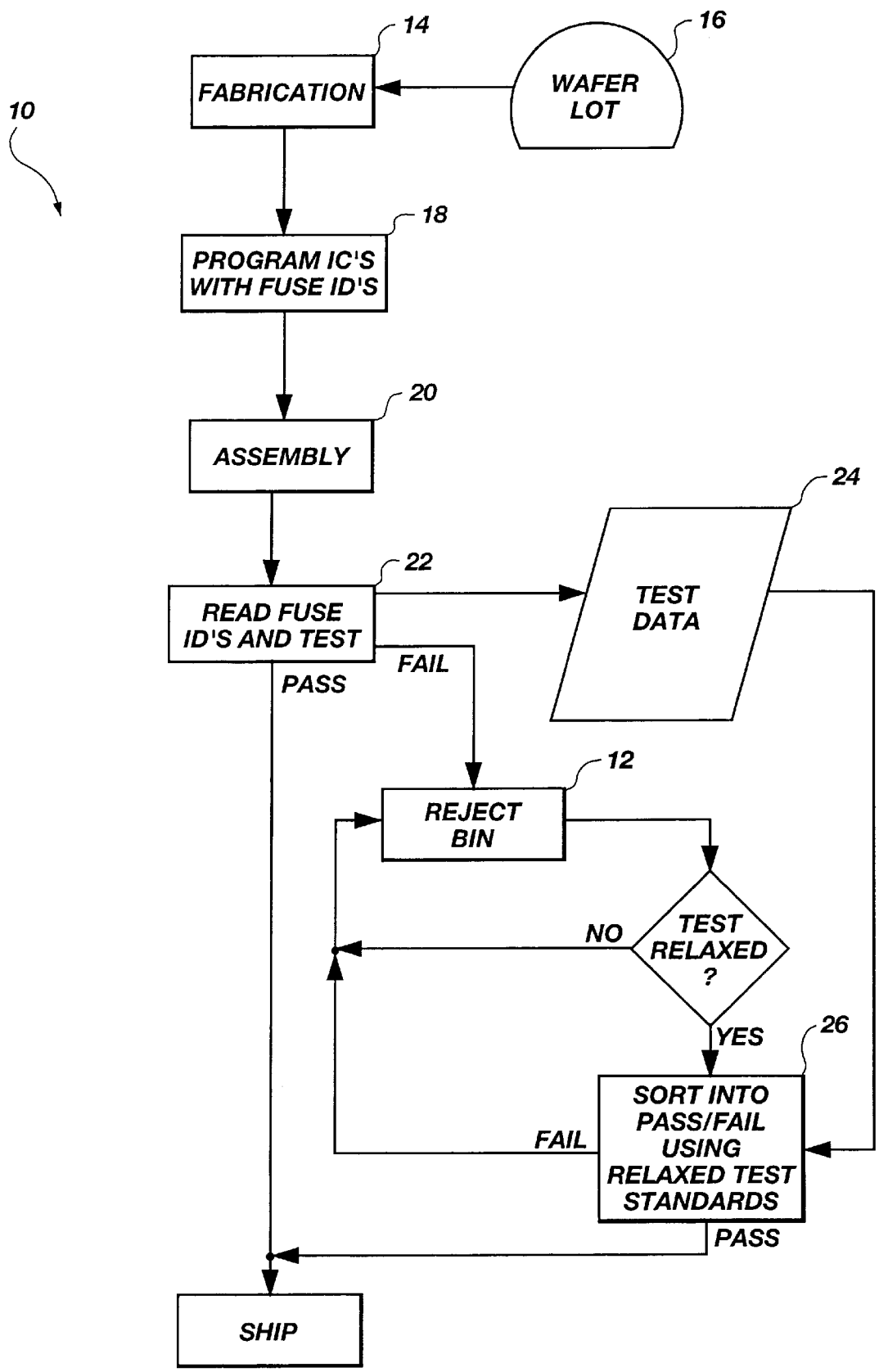
FIG. 5 is a flow diagram illustrating a procedure in an integrated circuit (IC) manufacturing process for culling shippable IC's from a reject bin in accordance with the present invention.

As shown in FIG. 5, an inventive method for sorting integrated circuit (IC) devices is embodied in a method 10 in an IC manufacturing process for culling shippable IC's from a reject bin 12. It will be understood by those having skill in the field of this invention that the present invention is applicable to sorting any IC devices, including Dynamic Random Access Memory (DRAM) IC's, Static Random Access Memory (SRAM) IC's, Synchronous DRAM (SDRAM) IC's, processor IC's, Single In-line Memory Modules (SIMM's), Dual In-line Memory Modules (DIMM's), and other Multi-Chip Modules (MCM's).

The method 10 includes the step 14 of fabricating IC's on wafers from a wafer lot 16. IC's fabricated on the wafers are then programmed in a program step 18 in the manner described above with a fuse identification (ID) unique to each IC. The fuse ID may identify a wafer lot ID, the week the IC's were fabricated, a wafer ID, a die location on the wafer, and a fabrication facility ID. It will be understood, of course, that the present invention includes within its scope IC's having any ID code, including those having fuse ID's. It will also be understood that the ID code for each IC need not be unique, but instead may only specify the wafer the IC comes from, for example.

Once programmed, the IC's proceed through an assembly step 20 to a test step 22 where the fuse ID's are automatically read and stored in association with test data 24 generated in the test step 22. Although the fuse ID's are typically read electronically, it will be understood that they may also be read optically if the fuse ID consists of "blown" laser fuses that are optically accessible. It will also be understood that the test data 24 may include data such as the following: data identifying the testing equipment that tested the IC's, operating personnel who operated the testing equipment, and the set-up of the equipment when the IC's were tested; and data indicating the time and date the IC's were tested, the yield of shippable IC's through the test step 22, and test results for the IC's from the various stages of the test step 22.

IC's that pass the test step 22 are typically shipped to customers, while those that fail the test step 22 are directed to the reject bin 12. At a point in time when test standards of the test step 22 have been relaxed as described above, the IC's in the reject bin 12 are sorted in a sort step 26 by reading the fuse ID of each IC, accessing the test data 24 associated with the fuse ID, and comparing the accessed test data 24 with the relaxed test standards. Those IC's that fail even the relaxed test standards are directed back to the reject bin 12, while those IC's that pass the relaxed test standards are typically shipped to customers. The method 10 thus successfully culls shippable IC's from the reject bin 12 without retesting the IC's.

Figure 6:
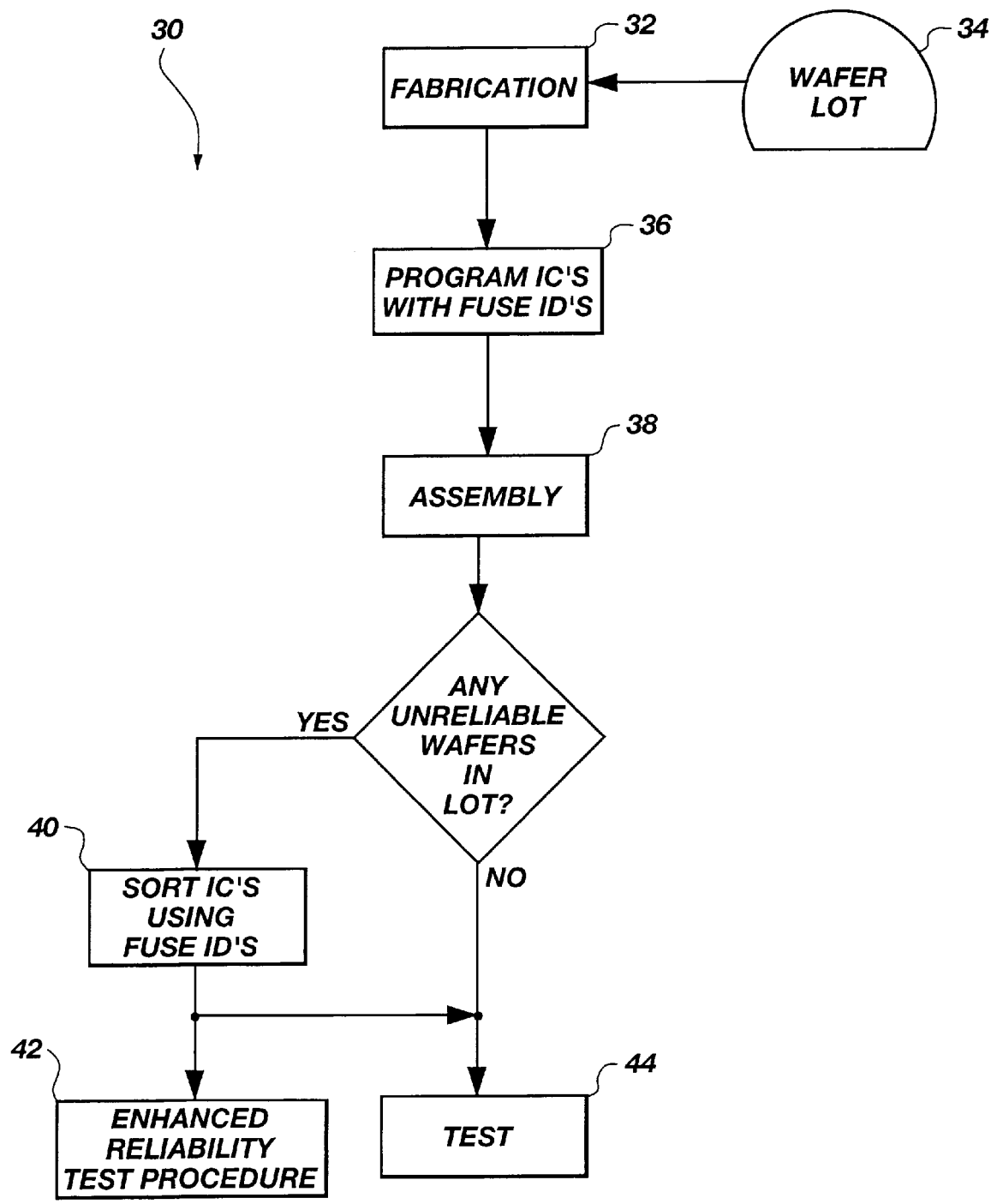
FIG. 6 is a flow diagram illustrating a procedure in an IC manufacturing process for directing IC's to enhanced reliability testing in accordance with another embodiment of the present invention.

As shown in FIG. 6, the inventive sorting method is also embodied in a back-end (i.e., after fabrication) test method 30 for separating IC's in need of enhanced reliability testing from a group of IC's undergoing back-end test procedures. IC's typically require enhanced reliability testing because the wafer they come from is unreliable as a result of fabrication errors and other unintended manufacturing process deviations.

The method 30 includes the step 32 of fabricating IC's on wafers from a wafer lot 34. IC's fabricated on the wafers are then programmed in a program step 36 in the manner described above with a fuse identification (ID) unique to each IC. The fuse ID may identify a wafer lot ID, the week the IC's were fabricated, a wafer ID, a die location on the wafer, and a fabrication facility ID. It will be understood, of course, that the present invention includes within its scope IC's having any ID code, including those having fuse ID's. It will also be understood that the ID code for each IC need not be unique, but instead may only specify the wafer the IC comes from, for example.

Once programmed, the IC's proceed through an assembly step 38. At this point in the IC manufacturing process, it is not uncommon for a number of wafers to have been identified as being unreliable for the reasons stated above. The fuse ID's of the IC's that come from these unreliable wafers may then be associated with a stored flag indicating the IC's come from unreliable wafers. If any wafers in the wafer lot 34 have been identified as being unreliable, the IC's proceed to a sort step 40, where their fuse ID's are automatically read so the IC's can be sorted into those flagged as coming from the unreliable wafers that require processing through an enhanced reliability testing step 42 and those not flagged as coming from the unreliable wafers that may proceed through a standard test step 44. Of course, those IC's that pass either the standard test step 44 or the enhanced reliability testing step 42 are typically shipped to customers, while those that fail these steps are directed to a reject bin (not shown).

Thus, the present invention provides a method 30 that directs those IC's needing enhanced reliability testing to the enhanced reliability testing step 42 while allowing those that do riot require enhanced reliability testing to proceed through the standard testing step 44.

Figure 7:
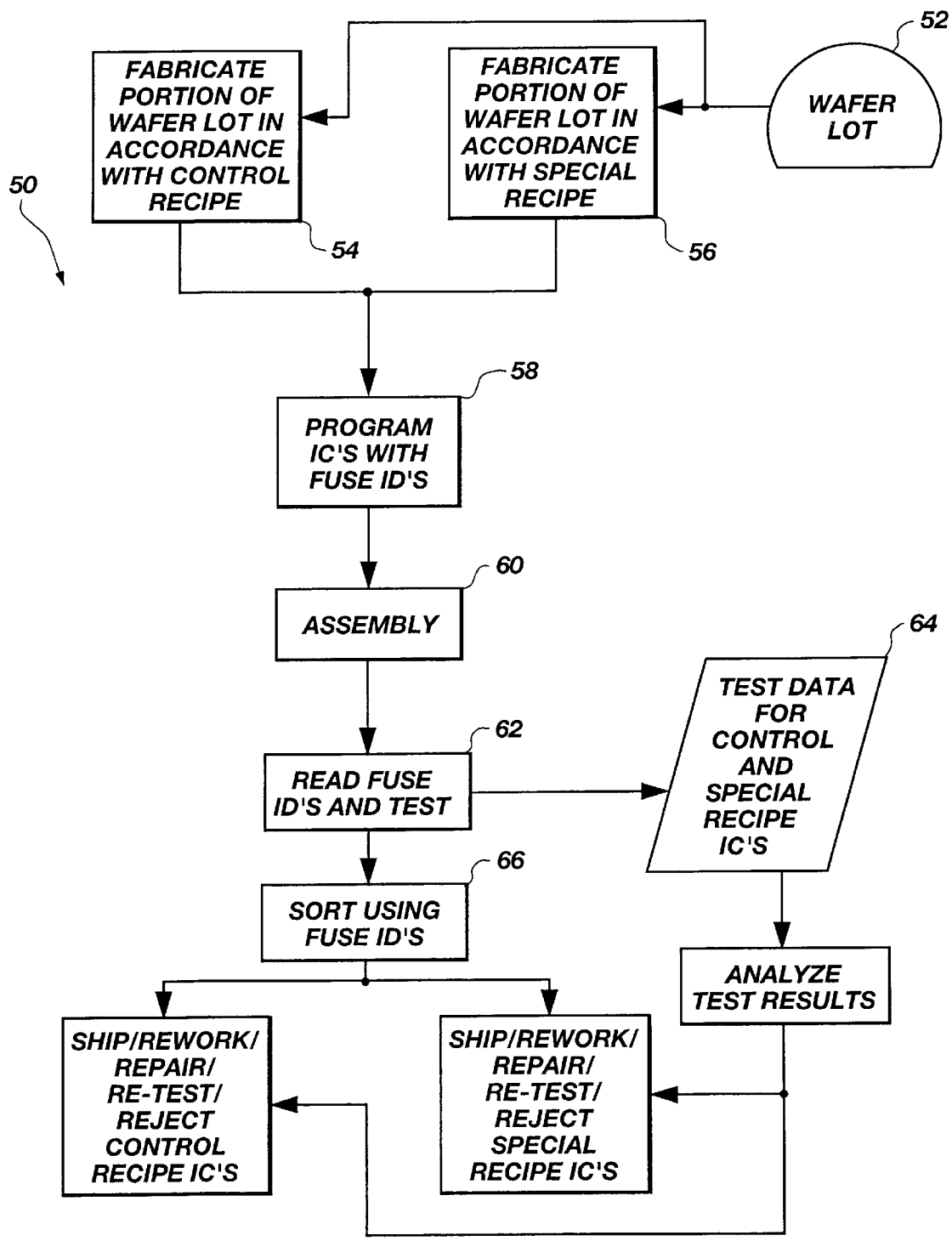
FIG. 7 is a flow diagram illustrating a procedure in an IC manufacturing process for testing a new or special fabrication process recipe in accordance with still another embodiment of the present invention.

As shown in FIG. 7, the inventive sorting method is further embodied in a method 50 for testing different fabrication process recipes. Such testing is typically done in accordance with a Special Work Request (SWR) from an engineer or technician.

The method 50 includes fabricating some of the wafers from a wafer lot 52 in a fabrication step 54 in accordance with a control process recipe that is typically the normal process recipe in use in the IC manufacturing process at the time. The remainder of the wafers from the wafer lot 52 are fabricated in another fabrication step 56 in accordance with a special or test process recipe. The special or test process recipe may change a variety of variables in the fabrication process, including doping, the thickness of IC layers, etc.

Once the IC's are fabricated in the fabrication steps 54 and 56, the IC's are then programmed in a program step 58 in the manner described above with a fuse identification (ID) unique to each IC. The fuse ID may identify a wafer lot ID, the week the IC's were fabricated, a wafer ID, a die location on the wafer, and a fabrication facility ID. It will be understood, of course, that the present invention includes within its scope IC's having any ID code, including those having fuse ID's. It will also be understood that the ID code for each IC need not be unique, but instead may only specify the wafer the IC comes from, for example.

Once programmed, the IC's proceed through an assembly step 60 to a test step 62 where the use ID's are automatically read and stored in association with test data 64 generated for both the control recipe IC's and the special or test recipe IC's in the test step 62. Although the fuse ID's are typically read electronically, it will be understood that they may also be read optically if the fuse ID consists of "blown" laser fuses that are optically accessible. It will also be understood that the test data 64 may include data such as the following: data identifying the testing equipment that tested the IC's, operating personnel who operated the testing equipment, and the set-up of the equipment when the IC's were tested; and data indicating the time and date the IC's were tested, the yield of shippable IC's through the test step 62, and test results for the IC's from the various stages of the test step 62.

Once the test data 64 is generated, the data 64 may be analyzed to determine those IC's that are shippable and those that are not, and to determine any differences in test results between the control recipe IC's and the special or test recipe IC's. The IC's are sorted in a sort step 66 so they may be shipped, reworked, repaired, retested, or rejected in accordance with the analysis of the test results.

By sorting the control recipe and special or test recipe IC's at the end of the IC manufacturing process, the method 50 is able to assemble and test the IC's together and thus eliminate unintended variables introduced into the process of testing the special or test recipe by the conventional method of assembling and testing the IC's separately. The inventive method 50 thus provides more reliable test results.

Figure 8:
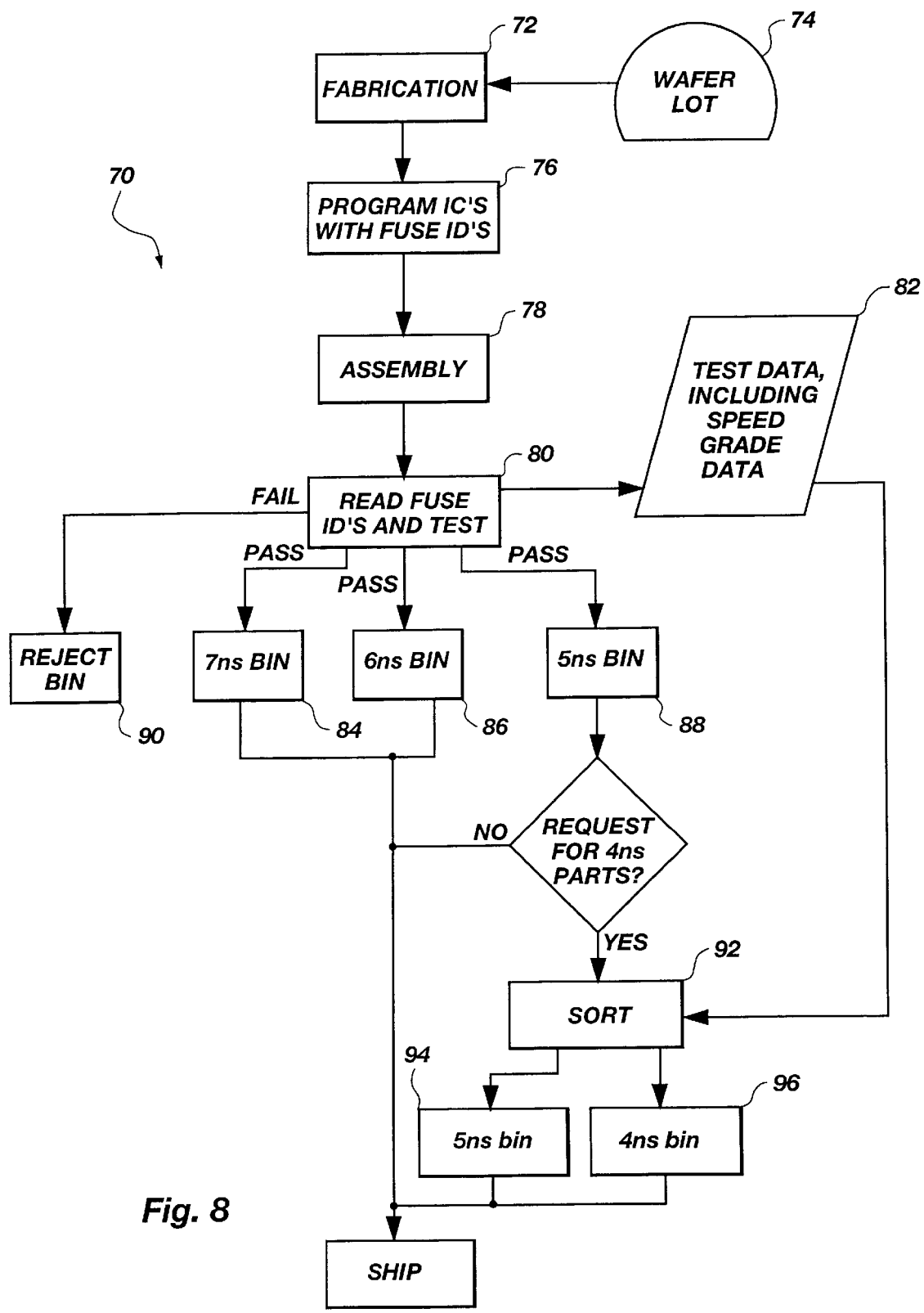
FIG. 8 is a flow diagram illustrating a procedure in an IC manufacturing process for speed-sorting IC's in accordance with a further embodiment of the present invention.

As shown in FIG. 8, the inventive method for sorting IC devices is also embodied in a method 70 in an IC manufacturing process for sorting IC devices in accordance with an IC standard, such as speed, that is more stringent than an IC standard that the devices were previously sorted in accordance with. It will be understood that although the method of FIG. 8 will be described with respect to speed-sorting, the method is applicable to all situations in which IC's previously sorted in accordance with an IC standard, such as speed, need to be sorted in accordance with another, more stringent IC standard. Such IC standards may include, for example, access time, data setup time, data hold time, standby current, refresh current, and operating current.

The method 70 includes the step 72 of fabricating IC's on wafers from a wafer lot 74. IC's fabricated on the wafers are then programmed in a program step 76 in the manner described above with a fuse identification (ID) unique to each IC. The fuse ID may identify a wafer lot ID, the week the IC's were fabricated, a wafer ID, a die location on the wafer, and a fabrication facility ID. It will be understood, of course, that the present invention includes within its scope IC's having any ID code, including those having fuse ID's.

Once programmed, the IC's proceed through an assembly step 78 to a test step 80 where the fuse ID's are automatically read and stored in association with test data 82 generated in the test step 80. Although the fuse ID's are typically read electronically, it will be understood that they may also be read optically if the fuse ID consists of "blown" laser fuses that are optically accessible. It will also be understood that the test data 82 includes speed grading data for each IC, as described above, and may include data such as the following: data identifying the testing equipment that tested the IC's, operating personnel who operated the testing equipment, and the set-up of the equipment when the IC's were tested; and data indicating the time and date the IC's were tested, the yield of shippable IC's through the test step 80, and test results for the IC's from the various stages of the test step 80.

IC's that pass the test step 80 are typically directed to speed graded bins 84, 86, and 88, while those that fail the test step 80 are directed to a reject bin 90. The speed graded bins 84, 86, and 88 typically each contain IC's of varying speeds. For example, the bin 88 may contain a variety of 5.0 ns, 4.5 ns, 4.0 ns, 3.5 ns, etc. parts, the bin 86 may contain a variety of 6.0 ns, 5.5 ns, 5.1 ns, etc. parts, and the bin 84 may contain a variety of 7.0 ns, 6.5 ns, 6.1, etc. parts.

On occasion, customers request IC's that meet a more stringent speed standard (e.g., 4 nanoseconds (ns)) than any of the IC's in the various bins 84, 86, and 88 have been graded for. While bin 88, for example, may contain IC's that will meet the more stringent speed standard, the bin 88 cannot be used to supply the customer's request because the IC's in the bin 88 have only been graded (i.e., are guaranteed to meet or exceed) a lower speed standard (e.g., 5 ns). Therefore, the present inventive method 70 sorts the IC's is a sort step 92 by reading the fuse ID of each IC, accessing the test data 82, including the speed-grading data, associated with the fuse ID, and comparing the accessed speed-grading data with the more stringent speed standard (e.g., 4 ns). Those IC's that fail the more stringent speed standard are directed to a speed graded bin 94, while those IC's that pass the more stringent speed standard are directed to another speed graded b n 96 where they can be used to fill the customer's request. The inventive method 70 thus sorts the IC's in accordance with a more stringent IC standard, such as speed, than they were previously sorted in accordance with without having to retest the IC's, and thus without reusing valuable testing resources to retest IC's.

Although the present invention has been described with reference to particular embodiments, the invention is not limited to these described embodiments. For example, while, the various steps of the embodiments of the inventive sorting method have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. In an integrated circuit (IC) manufacturing process, a method for recovering IC devices from a group of IC devices that has previously been rejected in accordance with a test standard, the IC devices being of the type having a substantially unique ID code, the method comprising:

permanently storing a unique ID code for each IC device of the group of IC devices comprising programming each of the IC devices of the group of IC devices to permanently store a unique fuse ID code;

developing a relaxed test standard different than the test standard;

storing test results that caused each IC device of the group of IC devices to be rejected in connection with the ID codes of each IC device of the group of IC devices that were rejected based upon the test standard;

automatically reading the ID code from each IC device of the group of IC devices;

accessing the test results stored in connection with each of the automatically read ID codes;

comparing the accessed test results for each of the IC devices with the relaxed test standard; and sorting the group of IC devices according to whether their test results pass the relaxed test standard to recover any IC device of the group of IC devices having test results that pass the relaxed test standard.

2. A method in an integrated circuit (IC) manufacturing process for sorting a group of IC devices in accordance with a first IC standard that has previously been sorted in accordance with a second IC standard that is less stringent than the first IC standard, the IC devices being of the type having a substantially unique ID code, the method comprising:

permanently storing a unique ID code for each IC device of the group of IC devices comprising programming each of the IC devices of the group of IC devices to permanently store a unique fuse ID code;

storing test results that caused each IC device of the group of IC devices to be sorted into the group in accordance with the second IC standard and the ID codes of each IC device of the group of IC devices;

automatically reading the ID code from each IC device of the group of IC devices;

accessing the test results stored in connection with each of the automatically read ID codes;

comparing the accessed test results for each IC device of the group of IC devices with the first IC standard; and sorting the group of IC devices according to whether their test results pass the first IC standard.

3. The method of claim 2, wherein the first and second IC standards are selected from a group comprising speed, access time, data setup time, data hold time, standby current, refresh current, and operating current.

* * * * *

UNITED STATES PATENT AND TRADEMARK OFFICE
CERTIFICATE OF CORRECTION

PATENT NO. : 6,100,486
DATED : August 8, 2000
INVENTOR(S) : Raymond J. Beffa

It is certified that error appears in the above-identified patent and that said Letters Patent is hereby corrected as shown below:

Title page,
Item [57], ABSTRACT,
Line 15, change "riot," to -- not, --
Item [63], Related U.S. Application Data, was not included:
                   Related U.S. Application Data
[63]   Divisional of application No. 08/785,353, filed on January 17, 1997, now Pat. No. 5,927,512

Drawings,
In Fig. 7, at box at bottom left insert reference numeral -- 68 -- and lead line therefor; and at box at bottom right insert reference numeral -- 67 -- and lead line therefor.

Column 1,
Line 5, after "a" insert -- a divisional and --;
Line 12, change "copending" to -- co-pending --;
Line 19, change "herewith, a" to -- herewith; a --;
Line 56, change "Frame" to -- frame --;

Column 3,
Line 52, change "first," to -- first IC standard, --;

Column 4,
Line 4, delete "(" before "connection";

Column 6,
Line 21, change "riot" to -- not --;
Line 65, after "analyzed" insert -- 67 --;

Column 7,
Line 4, after "control recipe" insert -- 68 -- and after "test recipe" insert -- 69 --;
Line 56, change "6.1," to -- 6.1 ns, --;
Line 65, change "is" to -- in --; and

UNITED STATES PATENT AND TRADEMARK OFFICE
CERTIFICATE OF CORRECTION

PATENT NO. : 6,100,486
DATED : August 8, 2000
INVENTOR(S) : Raymond J. Beffa

It is certified that error appears in the above-identified patent and that said Letters Patent is hereby corrected as shown below:

<u>Column 8,</u>
Line 7, change "b n 96" to -- bin 96 --.
Line 28, change "the type" to -- a type --; and
Line 54, change "the type" to -- a type --.

Signed and Sealed this

Fourteenth Day of May, 2002

Attest:

JAMES E. ROGAN
Attesting Officer    Director of the United States Patent and Trademark Office